(12) United States Patent
Kubota

(10) Patent No.: US 11,751,370 B2
(45) Date of Patent: Sep. 5, 2023

(54) CORRECTION AMOUNT CALCULATION DEVICE, COMPONENT MOUNTING MACHINE, AND CORRECTION AMOUNT CALCULATION METHOD

(71) Applicant: FUJI CORPORATION, Chiryu (JP)

(72) Inventor: Tomokatsu Kubota, Anjo (JP)

(73) Assignee: FUJI CORPORATION, Chiryu (JP)

( * ) Notice: Subject to any disclaimer, the term of this patent is extended or adjusted under 35 U.S.C. 154(b) by 104 days.

(21) Appl. No.: 17/430,769

(22) PCT Filed: Mar. 5, 2019

(86) PCT No.: PCT/JP2019/008716
§ 371 (c)(1),
(2) Date: Aug. 13, 2021

(87) PCT Pub. No.: WO2020/178990
PCT Pub. Date: Sep. 10, 2020

(65) Prior Publication Data
US 2022/0159886 A1    May 19, 2022

(51) Int. Cl.
*H05K 3/30* (2006.01)
*H05K 13/08* (2006.01)
*H05K 13/04* (2006.01)

(52) U.S. Cl.
CPC ......... *H05K 13/08* (2013.01); *H05K 13/0465* (2013.01)

(58) Field of Classification Search
CPC .............. H05K 13/04; H05K 13/0465; H05K 13/0815; H05K 13/0817; H05K 13/083
See application file for complete search history.

(56) References Cited

U.S. PATENT DOCUMENTS 9,332,684 B2 * 5/2016 Nagai ................... H05K 13/04
9,661,793 B2 * 5/2017 Itoh ..................... B23K 3/0638
(Continued)

FOREIGN PATENT DOCUMENTS

EP       3 096 596 A1    11/2016
JP       2005-252290 A    9/2005
(Continued)

OTHER PUBLICATIONS

International Search Report dated Jun. 4, 2019 in PCT/JP2019/008716 filed on Mar. 5, 2019 (2 pages).

*Primary Examiner* — Paul D Kim
(74) *Attorney, Agent, or Firm* — Oblon, McClelland, Maier & Neustadt, L.L.P.

(57) ABSTRACT

A correction amount calculation device includes a first acquisition section and a correction amount calculation section. The first acquisition section is configured to acquire a first positional deviation amount, which is a positional deviation amount of a printing position detected by a printing inspection machine with respect to a pad position, and a second positional deviation amount, which is a positional deviation amount of a mounting position detected by a appearance inspection machine with respect to the pad position. The correction amount calculation section is configured to, based on the first positional deviation amount and the second positional deviation amount, calculate a correction amount, which is used in the mounting process of a board product to be produced later, regarding a third positional deviation amount, which is a positional deviation amount of the mounting position with respect to the printing position.

8 Claims, 4 Drawing Sheets

(56) References Cited

U.S. PATENT DOCUMENTS

| | | | | |
|---|---|---|---|---|
| 11,140,801 B2* | 10/2021 | Oyama | ............... | H05K 13/041 |
| 2015/0271925 A1* | 9/2015 | Mori | ................... | H05K 13/085 |
| | | | | 29/832 |
| 2022/0151120 A1* | 5/2022 | Kubota | ................... | H05K 3/34 |

FOREIGN PATENT DOCUMENTS

| | | |
|---|---|---|
| JP | 2010-3824 A | 1/2010 |
| WO | WO 2015/029255 A1 | 3/2015 |

\* cited by examiner

| TARGET MOUNTING POSITION RF1 | BOARD IDENTIFICATION INFORMATION ID1 | | |
|---|---|---|---|
| | SYMBOL ID11 | SYMBOL ID12 | .. |
| SYMBOL R1 | ΔX11, ΔY11 | ΔX12, ΔY12 | .. |
| SYMBOL R2 | ΔX21, ΔY21 | ΔX22, ΔY22 | .. |
| SYMBOL R3 | ΔX31, ΔY31 | ΔX32, ΔY32 | .. |
| : | : | : | : |

| COMPONENT TYPE PT1 | BOARD IDENTIFICATION INFORMATION ID1 | | |
|---|---|---|---|
| | SYMBOL ID11 | SYMBOL ID12 | .. |
| SYMBOL P1 | ΔX11, ΔY11 | ΔX12, ΔY12 | .. |
| SYMBOL P2 | ΔX21, ΔY21 | ΔX22, ΔY22 | .. |
| SYMBOL P3 | ΔX31, ΔY31 | ΔX32, ΔY32 | .. |
| : | : | : | : |

CORRECTION AMOUNT CALCULATION DEVICE, COMPONENT MOUNTING MACHINE, AND CORRECTION AMOUNT CALCULATION METHOD

TECHNICAL FIELD

The present description discloses a technique related to a correction amount calculation device, a component mounting machine, and a correction amount calculation method.

BACKGROUND ART

Surface tension is generated when solder printed on a board melts. Since the surface tension is greatest at a center part of a pad, in a case in which a component is mounted in accordance with the solder, the component and the solder flow together toward the pad when the solder melts in a reflow furnace, and an electrode portion of the component is drawn to the center part of the pad. Therefore, in a component mounting machine, in some cases, the component is mounted in accordance with the solder printed on the board.

In a component mounting method disclosed in Patent Literature 1, solder position data is obtained for each mounting coordinate by a printing inspection machine, and the obtained solder position data is feed-forwarded to an operating component mounting machine on a downstream side. As a result, a control parameter of a mounting head is modified based on the solder position data, and the component is mounted on the solder.

In addition, in the component mounting method disclosed in Patent Literature 1, a positional deviation tendency of a mounting position of the component is determined by the appearance inspection machine, and a deviation of a positional deviation amount with respect to a normal position is obtained. The deviation data of the mounting position is fed back to the component mounting machine, and calibration for modifying the control parameter by the deviation is performed.

PATENT LITERATURE

Patent Literature 1: JP-A-2005-252290

BRIEF SUMMARY

Technical Problem

However, in the component mounting method disclosed in Patent Literature 1, the solder position data obtained by the printing inspection machine is not considered in the calculation of the correction amount fed back to the component mounting machine. Further, the normal position of the positional deviation amount obtained by the appearance inspection machine is not clear. As the normal position, for example, the mounting position in design, the printing position of the solder, or the like is assumed. Therefore, in the component mounting method disclosed in Patent Literature 1, it cannot be said that the correction amount when the component is mounted based on the printing position of the solder is necessarily appropriate.

In view of such circumstances, the present description discloses a correction amount calculation device, a component mounting machine, and a correction amount calculation method, which are capable of calculating an appropriate correction amount when a component is mounted based on a printing position of solder.

Solution to Problem

The present description discloses a correction amount calculation device including, in a board work line including a printing inspection machine, a component mounting machine, and an appearance inspection machine, a first acquisition section and a correction amount calculation section. The printing inspection machine is configured to inspect a printing position of solder printed by a printing machine. The component mounting machine is configured to perform a mounting process of mounting a component based on the printing position. The appearance inspection machine is configured to inspect a mounting position of the component mounted by the component mounting machine. The first acquisition section is configured to acquire a first positional deviation amount, which is a positional deviation amount of the printing position detected by the printing inspection machine with respect to a pad position, and a second positional deviation amount, which is a positional deviation amount of the mounting position detected by the appearance inspection machine with respect to the pad position. The correction amount calculation section is configured to, based on the first positional deviation amount and the second positional deviation amount, calculate a correction amount, which is used in the mounting process of a board product to be produced later, regarding a third positional deviation amount, which is a positional deviation amount of the mounting position with respect to the printing position.

Also, the present description discloses a correction amount calculation method which is applied to a board work line including a printing inspection machine, a component mounting machine, and an appearance inspection machine, the method including a first acquisition step and a correction amount calculation step. The printing inspection machine is configured to inspect a printing position of solder printed by a printing machine. The component mounting machine is configured to perform a mounting process of mounting a component based on the printing position. The appearance inspection machine is configured to inspect a mounting position of the component mounted by the component mounting machine. In the first acquisition step, a first positional deviation amount, which is a positional deviation amount of the printing position detected by the printing inspection machine with respect to a pad position, and a second positional deviation amount, which is a positional deviation amount of the mounting position detected by the appearance inspection machine with respect to the pad position are acquired. In the correction amount calculation step, a correction amount, which is used in the mounting process of a board product to be produced later, regarding a third positional deviation amount, which is a positional deviation amount of the mounting position with respect to the printing position is calculated based on the first positional deviation amount and the second positional deviation amount.

ADVANTAGEOUS EFFECTS

With the correction amount calculation device described above, the first acquisition section and the correction amount calculation section are provided. As a result, the correction amount calculation device can calculate the correction amount when the third positional deviation amount, which is the positional deviation amount of the mounting position with respect to the printing position, is corrected by using both the first positional deviation amount and the second positional deviation amount. The above description of the correction amount calculation device can be similarly applied to the correction amount calculation method. It should be noted that the component mounting machine disclosed in the present description can perform the mounting process based on the correction amount calculated by the correction amount calculation section.

DESCRIPTION OF EMBODIMENTS

1. Embodiment 1-1. Configuration Example of Board Work Line WML

Figure 1:
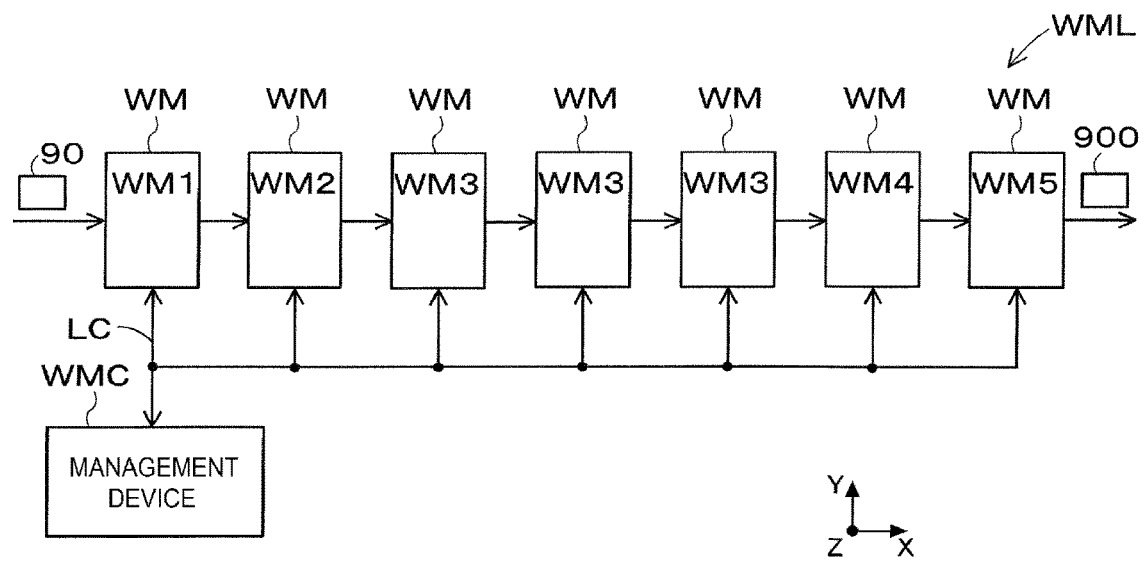
FIG. 1 is a configuration diagram showing a configuration example of board work line WML.

In board work line WML, a predetermined board work is performed with respect to board 90. The type and the number of board work machines WM, which configure board work line WML, are not limited. As shown in FIG. 1, board work line WML of the present embodiment includes multiple (seven) board work machines WM of printing machine WM1, printing inspection machine WM2, multiple (three) component mounting machines WM3, appearance inspection machine WM4, and reflow furnace WM5, and board 90 is conveyed in this order by a board conveyance device (not shown).

Printing machine WM1 prints solder 92 on board 90 at a mounting position of each of multiple components 91. Printing inspection machine WM2 inspects a printing state of solder 92 printed by printing machine WM1. Component mounting machine WM3 performs a mounting process of mounting component 91 to board 90 on which solder 92 is printed. One or multiple component mounting machines WM3 may be provided. As in the present embodiment, in a case in which multiple component mounting machines WM3 are provided, multiple components 91 can be mounted by allocation to multiple component mounting machines WM3.

Appearance inspection machine WM4 inspects a mounting state of component 91 mounted by component mounting machine WM3. Reflow furnace WM5 heats board 90 on which component 91 is mounted and melts solder 92 to perform soldering. As described above, board work line WML can convey board 90 in order by using multiple (seven) board work machines WM, perform a production process including an inspection process, and produce board product 900. It should be noted that board work line WML can include, as required, board work machine WM such as, for example, a function inspection machine, a buffer device, a board supply device, a board flipping device, a shield mounting device, an adhesive application device, and an ultraviolet irradiation device.

Multiple (seven) board work machines WM, which configure board work line WML, and management device WMC are electrically connected by communication section LC. Specifically, communication section LC can communicably connect multiple (seven) board work machines WM and management device WMC to each other by wired or wireless communication. Further, as a communication method, various methods can be adopted.

In the present embodiment, a local area network (LAN) is formed by multiple (seven) board work machines WM and management device WMC. As a result, multiple (seven) board work machines WM can communicate with each other via communication section LC. Also, multiple (seven) board work machines WM can communicate with management device WMC via communication section LC.

Management device WMC controls multiple (seven) board work machines WM, which configure board work line WML, and monitors an operation status of board work line WML. Various control data for controlling multiple (seven) board work machines WM are stored in management device WMC. Management device WMC transmits the control data to each of multiple (seven) board work machines WM. Each of multiple (seven) board work machines WM transmits the operation status and a production status to management device WMC.

1-2. Configuration Example of Component Mounting Machine WM3

Figure 2:
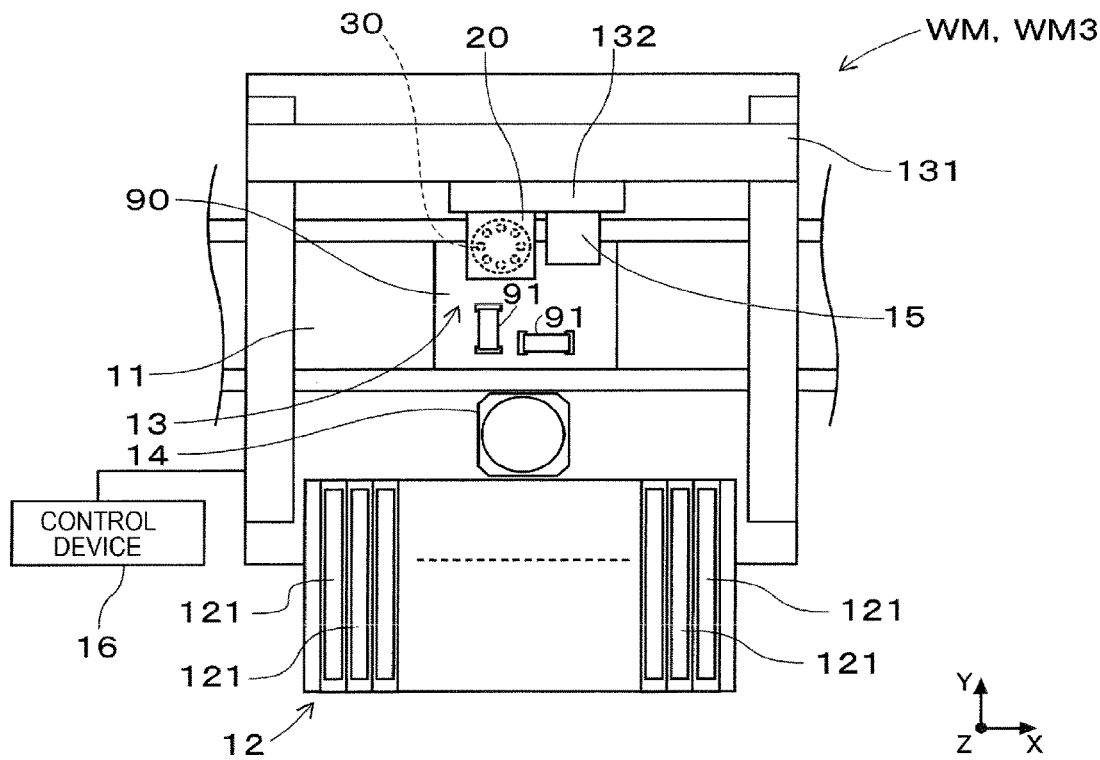
FIG. 2 is a plan view showing a configuration example of component mounting machine WM3.

Component mounting machine WM3 performs a mounting process of mounting component 91 to board 90 on which solder 92 is printed. As shown in FIG. 2, component mounting machine WM3 includes board conveyance device 11, component supply device 12, component transfer device 13, part camera 14, board camera 15, and control device 16.

Board conveyance device 11 includes, for example, a belt conveyor or the like, and conveys board 90 in a conveyance direction (X-axis direction). Board 90 is a circuit board, and at least one of an electronic circuit and an electrical circuit is formed thereon. Board conveyance device 11 conveys board 90 to the inside of component mounting machine WM3, and positions board 90 at a predetermined position inside the machine. After the mounting process of component 91 by component mounting machine WM3 is completed, board conveyance device 11 conveys board 90 to the outside of component mounting machine WM3.

Component supply device 12 supplies multiple components 91 to be mounted on board 90. Component supply device 12 includes multiple feeders 121 which are provided along the conveyance direction of board 90 (X-axis direction). Each of multiple feeders 121 pitch-feeds a carrier tape (not shown) which stores multiple components 91 to supply component 91 so that component 91 can be picked up at a supply position located on a distal end side of feeder 121. Also, component supply device 12 can supply relatively large electronic components (for example, lead components) as compared with chip components or the like, in a state of being disposed on a tray.

Component transfer device 13 includes head driving device 131 and moving body 132. Head driving device 131 is configured to move moving body 132 in the X-axis direction and the Y-axis direction by a linear motion mechanism. Mounting head 20 is detachably (exchangeably) mounted on moving body 132 by a clamp member (not shown). Mounting head 20 picks up and holds component 91 supplied by component supply device 12 by using at least one holding member 30, and mounts component 91 on board 90 positioned by board conveyance device 11. As holding member 30, for example, a suction nozzle, a chuck, or the like can be used.

As part camera 14 and board camera 15, a well-known imaging device can be used. Part camera 14 is fixed to a base of component mounting machine WM3 such that an optical axis thereof is directed upward (vertical upward direction) in a Z-axis direction. Part camera 14 can image component 91 held by holding member 30 from below.

Board camera 15 is provided in moving body 132 of component transfer device 13 such that an optical axis thereof is directed downward in the Z-axis direction (vertical downward direction). Board camera 15 can capture an image of board 90 from above. Part camera 14 and board camera 15 perform imaging based on control signals transmitted from control device 16. Image data captured by part camera 14 and board camera 15 is transmitted to control device 16.

Control device 16 includes well-known computing device and storage device, and a control circuit is provided therein (both of which are not shown). The information, the image data, and the like output from various sensors provided in component mounting machine WM3 are input to control device 16. Control device 16 transmits the control signals to each device based on a control program, a predetermined mounting condition, which is set in advance, and the like.

For example, control device 16 causes board camera 15 to image board 90 which is positioned by board conveyance device 11. Control device 16 performs image processing on the image captured by board camera 15 to recognize a positioning state of board 90. Also, control device 16 causes holding member 30 to pick up and hold component 91 supplied by component supply device 12, and causes part camera 14 to image component 91 held by holding member 30. Control device 16 performs the image processing on the image captured by part camera 14 to recognize a holding posture of component 91.

Control device 16 moves holding member 30 toward above a scheduled mounting position, which is set in advance by the control program or the like. Further, based on the positioning state of board 90, the holding posture of component 91, and the like, control device 16 corrects the scheduled mounting position to set the mounting position on which component 91 is actually mounted. The scheduled mounting position and the mounting position include a rotation angle in addition to the position (X-axis coordinate and Y-axis coordinate).

Control device 16 corrects a target position (X-axis coordinate and Y-axis coordinate) of holding member 30 and the rotation angle in accordance with the mounting position. Control device 16 lowers holding member 30 at the corrected rotation angle at the corrected target position to mount component 91 on board 90. Control device 16 repeats the pick-and-place cycle to perform the mounting process of mounting multiple components 91 on board 90.

1-3. Correction Amount Calculation Device 40 and Component Mounting Machine WM3

Correction amount calculation device 40 includes first acquisition section 41 and correction amount calculation section 42, as a control block. It is preferable that correction amount calculation device 40 further include permission section 43. In addition, it is preferable that component mounting machine WM3 include second acquisition section 44 and mounting process section 45. It should be noted that permission section 43 can be provided in component mounting machine WM3.

Figure 3:
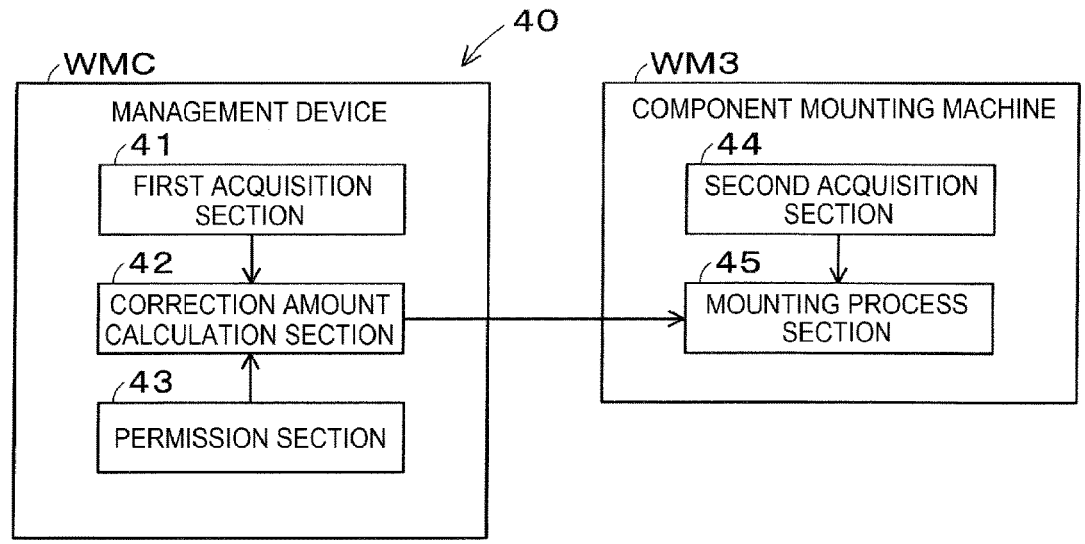
FIG. 3 is a block diagram showing an example of a control block of correction amount calculation device 40.

As shown in FIG. 3, correction amount calculation device 40 of the present embodiment includes first acquisition section 41, correction amount calculation section 42, and permission section 43. As shown in FIG. 3, correction amount calculation device 40 of the present embodiment is provided in management device WMC. Correction amount calculation device 40 can be provided in various computing devices other than management device WMC.

Figure 4:
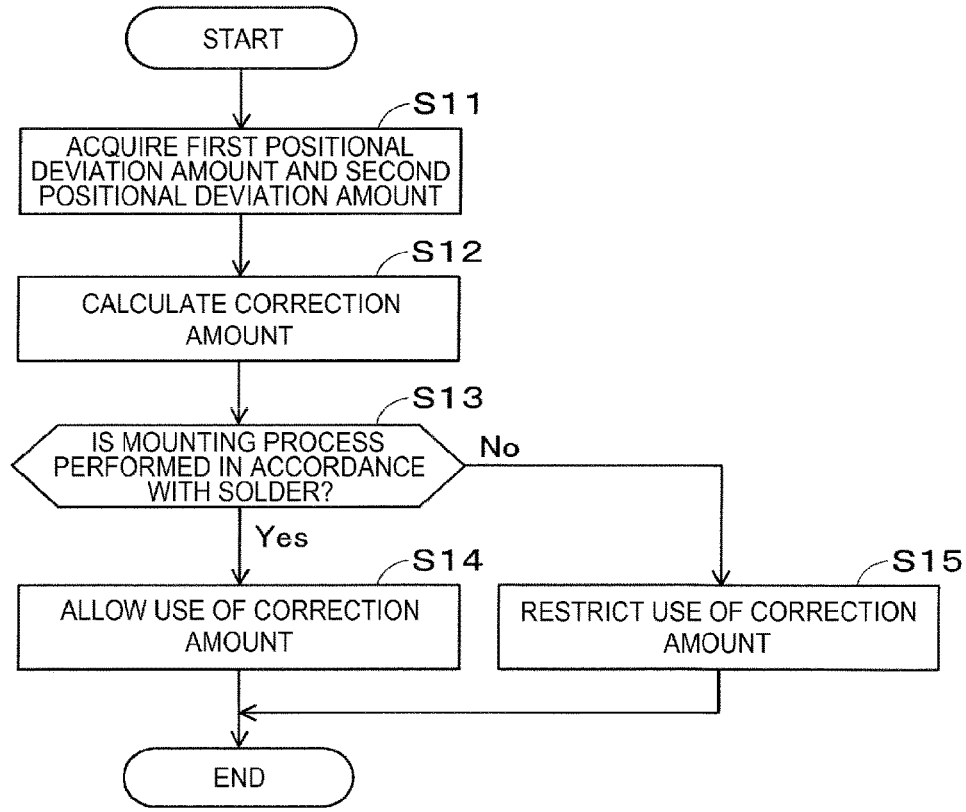
FIG. 4 is a flowchart showing an example of a control procedure by management device VVMC.

Management device VVMC executes the control program according to a flowchart shown in FIG. 4. First acquisition section 41 performs a process shown in step S11. Correction amount calculation section 42 performs a process shown in step S12. Permission section 43 performs determination shown in step S13 and processes shown in steps S14 and S15. In addition, component mounting machine WM3 executes the control program according to a flowchart shown in FIG. 5. Second acquisition section 44 performs a process shown in step S21. Mounting process section 45 performs a process shown in step S22.

1-3-1. First Acquisition Section 41

First acquisition section 41 acquires first positional deviation amount MA1 and second positional deviation amount MA2 (step S11 shown in FIG. 4). First positional deviation amount MA1 refers to a positional deviation amount of printing position PP1 with respect to pad position PD1 detected by printing inspection machine WM2. Second positional deviation amount MA2 refers to a positional deviation amount of mounting position MP1 with respect to pad position PD1 detected by appearance inspection machine WM4. It should be noted that the positional deviation amount of mounting position MP1 with respect to printing position PP1 is defined as third positional deviation amount MA3. In addition, first acquisition section 41 acquires first positional deviation amount MA1 and second positional deviation amount MA2 for each target mounting position RF1.

Figure 6:
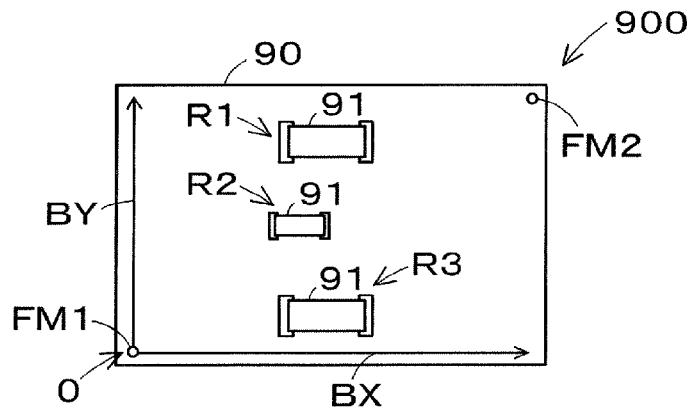
FIG. 6 is a schematic diagram showing an example of board product 900.

FIG. 6 shows an example of board product 900. As shown in FIG. 6, first mark portion FM1 and second mark portion FM2 are provided on board 90. First mark portion FM1 and second mark portion FM2 are positioning references of board 90, which are called fiducial marks, and are provided in an outer edge part of board 90. A board coordinate system, which is a coordinate system set on board 90, can be defined by a positional relationship between first mark portion FM1 and second mark portion FM2, and X-axis direction BX and Y-axis direction BY.

In the present embodiment, origin 0 of the board coordinate system is provided in first mark portion FM1. For example, control device 16 of component mounting machine WM3 shown in FIG. 2 can cause board camera 15 to image first mark portion FM1 and second mark portion FM2, perform the image processing on the acquired images, acquire the position and the angle of board 90 to obtain the board coordinate system. Also, target mounting position RF1 of each of multiple (three in FIG. 6, for convenience of illustration) components 91 on board 90 can be represented by using the board coordinate system. In FIG. 6, target mounting position RF1 is represented by symbols R1 to R3.

Figure 7:
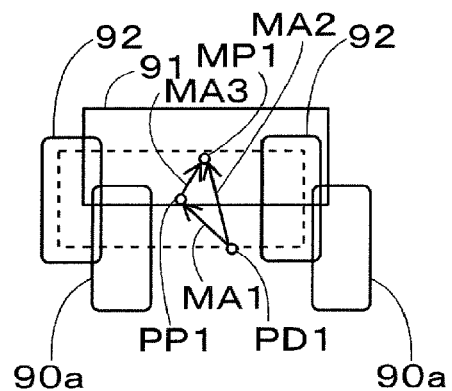
FIG. 7 is a schematic diagram showing an example of a relationship among first positional deviation amount MA1, second positional deviation amount MA2, and third positional deviation amount MA3.

FIG. 7 shows an example of the positional relationship among pad 90a formed on board 90, solder 92 printed by printing machine WM1, and component 91 mounted by component mounting machine WM3, for one component 91 among multiple (three) components 91 shown in FIG. 6. Pad 90a is also called a land, and is formed in a wiring pattern of the circuit. For example, component 91 in FIG. 7 includes two electrode portions, and two pads 90a are provided for one component 91.

Solder 92 electrically connects pad 90a and the electrode portions of component 91. Ideally, printing machine WM1 prints solder 92 on pad 90a and component mounting machine WM3 mounts component 91 on solder 92. However, printing position PP1 of solder 92 and mounting position MP1 of component 91 have a possibility of deviating from the target position due to various factors such as a positioning error of board 90 and an operation error of the device.

Here, a centroid position of multiple (two in FIG. 7) pads 90a provided for one component 91 is defined as pad position PD1. In addition, a centroid position of multiple (two in FIG. 7) solders 92 printed on board 90 for component 91 is defined as printing position PP1. Further, a centroid position of component 91 when component 91 is mounted on board 90 is defined as mounting position MP1. In this case, first positional deviation amount MA1, which is the positional deviation amount of printing position PP1 with respect to pad position PD1, indicates the deviation between the target printing position (pad position PD1) of solder 92 and actual printing position PP1.

Surface tension is generated when solder 92 printed on board 90 melts. Since the surface tension is greatest at a center part of pad 90a, in a case in which component 91 is mounted in accordance with solder 92, component 91 and solder 92 flow together toward pad 90a when solder 92 melts in reflow furnace WM5, and the electrode portions of component 91 are drawn to the center part of pad 90a.

Accordingly, in component mounting machine WM3, in some cases, component 91 is mounted in accordance with solder 92 printed on board 90 (see the square shown by dashed line in FIG. 7). In this case, third positional deviation amount MA3, which is the positional deviation amount of mounting position MP1 with respect to printing position PP1, indicates the deviation between target mounting position RF1 (printing position PP1) of component 91 and actual mounting position MP1.

First positional deviation amount MA1 is detected by printing inspection machine WM2. Printing inspection machine WM2 inspects printing position PP1 of solder 92 printed by printing machine WM1. For example, printing inspection machine WM2 can cause the imaging device to image board 90, perform the image processing on the acquired image, acquire the position and the angle of board 90 based on first mark portion FM1 and second mark portion FM2 to obtain the board coordinate system.

In addition, printing inspection machine WM2 can perform the image processing on the acquired image to acquire a coordinate value of printing position PP1 of solder 92. Printing inspection machine WM2 can detect first positional deviation amount MA1 from the deviation between the acquired coordinate value of printing position PP1 and a known coordinate value of pad position PD1. Printing inspection machine WM2 detects first positional deviation amount MA1 for each of the X-coordinate and the Y-coordinate.

Second positional deviation amount MA2, which is the positional deviation amount of mounting position MP1 with respect to pad position PD1, is detected by appearance inspection machine WM4. Appearance inspection machine WM4 inspects mounting position MP1 of component 91 mounted by component mounting machine WM3. For example, appearance inspection machine WM4 can cause the imaging device to image board 90, perform the image processing on the acquired image, acquire the position and the angle of board 90 based on first mark portion FM1 and second mark portion FM2 to obtain the board coordinate system.

In addition, appearance inspection machine WM4 can perform the image processing on the acquired image to acquire a coordinate value of mounting position MP1 of component 91. Appearance inspection machine WM4 can detect second positional deviation amount MA2 from the deviation between the acquired coordinate value of mounting position MP1 and a known coordinate value of pad position PD1. Appearance inspection machine WM4 detects second positional deviation amount MA2 for each of the X-coordinate and the Y-coordinate.

1-3-2. Correction Amount Calculation Section 42

Correction amount calculation section 42 calculates correction amount CA1, which is used in the mounting process of board product 900 to be produced later, regarding third positional deviation amount MA3 based on first positional deviation amount MA1 and second positional deviation amount MA2 (step S12 shown in FIG. 4).

As shown in FIG. 7, third positional deviation amount MA3, which is the positional deviation amount of mounting position MP1 with respect to printing position PP1, can be calculated based on first positional deviation amount MA1 and second positional deviation amount MA2. Specifically, third positional deviation amount MA3 in X-axis direction BX can be calculated by subtracting first positional deviation amount MA1 in X-axis direction BX from second positional deviation amount MA2 in X-axis direction BX. Third positional deviation amount MA3 in Y-axis direction BY can be calculated by subtracting first positional deviation amount MA1 in Y-axis direction BY from second positional deviation amount MA2 in Y-axis direction BY.

Accordingly, correction amount calculation section 42 can calculate correction amount CA1 in X-axis direction BX by subtracting second positional deviation amount MA2 in X-axis direction BX from first positional deviation amount MA1 in X-axis direction BX. Further, correction amount calculation section 42 can calculate correction amount CA1 in Y-axis direction BY by subtracting second positional deviation amount MA2 in Y-axis direction BY from first positional deviation amount MA1 in Y-axis direction BY. It should be noted that correction amount calculation section 42 calculates correction amount CA1 for each target mounting position RF1.

As described above, correction amount calculation section 42 can calculate correction amount CA1 for one board 90 based on first positional deviation amount MA1 and second positional deviation amount MA2 acquired by first acquisition section 41. However, third positional deviation amount MA3 has a possibility of varying among multiple boards 90 due to various factors such as the positioning error of board 90 and the operation error of the device.

Accordingly, it is preferable that correction amount calculation section 42 store, regarding multiple boards 90 of the same type, board identification information ID1 for identifying board 90 and third positional deviation amount MA3 for each target mounting position RF1 of multiple components 91 to be mounted on board 90 in association with each other. In addition, it is preferable that correction amount calculation section 42 calculate correction amount CA1 for each target mounting position RF1 based on the distribution of a predetermined number of third positional deviation amounts MA3 for each target mounting position RF1. As a result, correction amount calculation section 42 can calculate correction amount CA1 for each target mounting position RF1 in consideration of the variation in third positional deviation amount MA3 among multiple boards 90.

Management device WMC shown in FIG. 1 includes a well-known storage device. Printing inspection machine WM2 transmits, to management device WMC, board identification information ID1 of board 90 and detected first positional deviation amount MA1 for each target mounting position RF1 in association with each other. Similarly, appearance inspection machine WM4 transmits, to management device WMC, board identification information ID1 of board 90 and detected second positional deviation amount MA2 for each target mounting position RF1 in association with each other.

First acquisition section 41 acquires first positional deviation amount MA1 and second positional deviation amount MA2 for each target mounting position RF1, which are associated with same board identification information ID1. Then, correction amount calculation section 42 calculates third positional deviation amount MA3 for each target mounting position RF1 based on first positional deviation amount MA1 and second positional deviation amount MA2 for each target mounting position RF1, which are associated with same board identification information ID1, and stores calculated third positional deviation amount MA3 in the storage device. It should be noted that the storage device can also store first positional deviation amount MA1, second positional deviation amount MA2, and third positional deviation amount MA3 for each target mounting position RF1, which are associated with same board identification information ID1.

Figures 8A, 8B, 9:
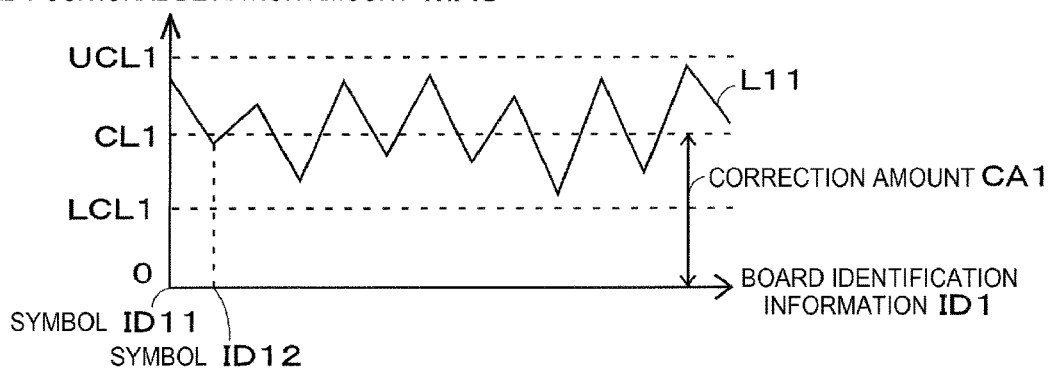
FIG. 8A is a schematic diagram showing an example of a state in which board identification information ID1 and third positional deviation amount MA3 for each target mounting position RF1 are stored in association with each other.
FIG. 8B is a schematic diagram showing an example of a state in which board identification information ID1 and third positional deviation amount MA3 for each component type PT1 are stored in association with each other.
FIG. 9 is a schematic diagram showing an example of a distribution of third positional deviation amounts MA3.

FIG. 8A shows an example of a state in which board identification information ID1 and third positional deviation amount MA3 for each target mounting position RF1 are stored in association with each other. Symbol ID11 indicates board identification information ID1 of first board 90 of multiple boards 90 of the same type. Similarly, symbol ID12 indicates board identification information ID1 of second board 90 of multiple boards 90 of the same type. Further, symbol R1 indicates one target mounting position RF1 among multiple target mounting positions RF1. Similarly, symbol R2 and symbol R3 indicate other target mounting positions RF1 among multiple target mounting positions RF1.

For example, in board 90 in which board identification information ID1 is indicated by symbol ID1 1, third positional deviation amount MA3 of X-axis direction BX, when component 91 is mounted at the position in which target mounting position RF1 is represented by symbol R1, is represented by deviation $\Delta X11$. Similarly, in board 90 in which board identification information ID1 is indicated by symbol ID11, third positional deviation amount MA3 in Y-axis direction BY, when component 91 is mounted on the position in which target mounting position RF1 is represented by symbol R1, is represented by deviation $\Delta Y11$. The above description can be similarly applied to another board identification information ID1 and target mounting position RF1.

In addition, correction amount calculation section 42 may store, regarding multiple boards 90 of the same type, board identification information ID1 for identifying board 90 and third positional deviation amount MA3 for each component type PT1 of multiple components 91 to be mounted on board 90 in association with each other. Correction amount calculation section 42 may calculate correction amount CA1 for each component type PT1 based on the distribution of the predetermined number of third positional deviation amounts MA3 for each component type PT1. As a result, correction amount calculation section 42 can calculate correction amount CA1 for each component type PT1 in consideration of the variation in third positional deviation amount MA3 among multiple boards 90.

In this case, printing inspection machine WM2 transmits, to management device WMC, board identification information ID1 of board 90 and detected first positional deviation amount MA1 for each component type PT1 in association with each other. Similarly, appearance inspection machine WM4 transmits, to management device VVMC, board identification information ID1 of board 90 and detected second positional deviation amount MA2 for each component type PT1 in association with each other.

First acquisition section 41 acquires first positional deviation amount MA1 and second positional deviation amount MA2 for each component type PT1, which are associated with same board identification information ID1. Then, correction amount calculation section 42 calculates third positional deviation amount MA3 for each component type PT1 based on first positional deviation amount MA1 and second positional deviation amount MA2 for each component type PT1, which are associated with same board identification information ID1, and stores calculated third positional deviation amount MA3 in the storage device. It should be noted that in a case in which multiple components 91 having same component type PT1 are mounted on one board 90, correction amount calculation section 42 can calculate third positional deviation amount MA3 for all or a part of components 91, and store calculated third positional deviation amount MA3 in the storage device.

FIG. 8B shows an example of a state in which board identification information ID1 and third positional deviation amount MA3 for each component type PT1 are stored in association with each other. FIG. 8B is different from FIG. 8A in that target mounting position RF1 is changed to component type PT1. Symbols P1 to P3 indicate multiple component types PT1. Therefore, the above description of target mounting position RF1 based on FIG. 8A can be similarly applied to component type PT1 by replacing target mounting position RF1 with component type PT1. It should be noted that although third positional deviation amounts MA3 in FIG. 8A and FIG. 8B coincide for convenience of illustration, third positional deviation amounts MA3 in FIG. 8A and FIG. 8B may be different.

In addition, correction amount calculation section 42 may store, regarding multiple boards 90 of the same type, board identification information ID1 for identifying board 90 and third positional deviation amount MA3 for each predetermined region on board 90 in which component 91 is mounted in association with each other. Correction amount calculation section 42 may calculate correction amount CA1 for each region on board 90 based on the distribution of the predetermined number of third positional deviation amounts MA3 for each region on board 90. As a result, correction amount calculation section 42 can calculate correction amount CA1 for each region on board 90 in consideration of the variation in third positional deviation amount MA3 among multiple boards 90.

The region on board 90 can be optionally set, and the number, the size, and the like of the region are not limited. Correction amount calculation section 42 can, for example, uniformly divide board 90 to set multiple regions. Also, correction amount calculation section 42 can set the region in consideration of a region, for example, which is easily affected by the operation error of the device, the flip of board 90, or the like. In either case, correction amount calculation section 42 can store board identification information ID1 and third positional deviation amount MA3 for each region on board 90 in association with each other, in the same manner as in FIGS. 8A and 8B.

It is preferable that correction amount calculation section 42 calculate correction amount CA1 when it is determined that the distribution of third positional deviation amounts MA3 is in a management state by using a Shewhart control chart. As a result, correction amount calculation section 42 can easily calculate correction amount CA1 in consideration of the variation in third positional deviation amount MA3 among multiple boards 90.

The Shewhart control chart is used, for example, to determine whether a measurement value is in a managed stable state (management state). In the Shewhart control chart, it is determined that the measurement value is in the management state when the measurement value does not exhibit a peculiar distribution. FIG. 9 shows an example of the distribution of third positional deviation amount MA3. The horizontal axis in FIG. 9 indicates board identification information ID1, and the vertical axis indicates third positional deviation amount MA3. Polygonal line L11 can be generated by plotting third positional deviation amount MA3 for each board identification information ID1 regarding multiple boards 90 of the same type. Polygonal line L11 can be generated for each of third positional deviation amount MA3 in X-axis direction BX and third positional deviation amount MA3 in Y-axis direction BY.

Dashed line CL1 indicates, for example, an average value of multiple third positional deviation amounts MA3. Dashed line UCL1 indicates a management upper limit value, and dashed line LCL1 indicates a management lower limit value. The management upper limit value can be calculated, for example, by adding a standard deviation of three times to the average value of multiple third positional deviation amounts MA3. The management lower limit value can be calculated, for example, by subtracting the standard deviation of three times from the average value of multiple third positional deviation amounts MA3.

Correction amount calculation section 42 can determine that the distribution of third positional deviation amounts MA3 is in the management state when the predetermined number of third positional deviation amounts MA3 are equal to or more than the management lower limit value indicated by dashed line LCL1 and equal to or less than the management upper limit value indicated by dashed line UCL1. Conversely, correction amount calculation section 42 can determine that the distribution of third positional deviation amounts MA3 is not in the management state when at least one third positional deviation amount MA3 among the predetermined number of third positional deviation amounts MA3 exceeds the management upper limit value.

Similarly, correction amount calculation section 42 can determine that the distribution of third positional deviation amounts MA3 is not in the management state when at least one third positional deviation amount MA3 among the predetermined number of third positional deviation amounts MA3 are less than the management lower limit value. In addition, a region between dashed line UCL1 and dashed line CL1 is defined as a positive side region, and a region between dashed line CL1 and dashed line LCL1 is defined as a negative side region.

Correction amount calculation section 42 can also determine that the distribution of third positional deviation amounts MA3 is not in the management state when although the predetermined number of third positional deviation amounts MA3 are equal to or more than the management lower limit value indicated by dashed line LCL1 and equal to or less than the management upper limit value indicated by dashed line UCL1, the distribution of a considerable number of third positional deviation amounts MA3 is abnormal. For example, correction amount calculation section 42 can determine that the distribution of third positional deviation amount MA3 is abnormal when the considerable number of third positional deviation amounts MA3 are continuously distributed in the same region of the positive side region or the negative side region and the variation width of the considerable number of third positional deviation amounts MA3 is small compared with a predetermined variation width.

As described above, correction amount calculation section 42 can calculate the average value of multiple third positional deviation amounts MA3 indicated by dashed line CL1 as correction amount CA1 when it is determined that the distribution of third positional deviation amounts MA3 is in the management state by using the Shewhart control chart. In addition, each time first acquisition section 41 acquires the predetermined number of first positional deviation amounts MA1 and second positional deviation amounts MA2, correction amount calculation section 42 can acquire the distribution of the predetermined number of third positional deviation amounts MA3, and calculate correction amount CA1 in consideration of the variation in third positional deviation amount MA3 among multiple boards 90. Correction amount calculation section 42 can improve the calculation accuracy of correction amount CA1 by regularly repeating the process.

1-3-3. Permission Section 43

Permission section 43 allows the use of correction amount CA1 calculated by correction amount calculation section 42 when component 91 is mounted in accordance with solder 92, and restricts the use of correction amount CA1 calculated by correction amount calculation section 42 when component 91 is mounted in accordance with pad 90a (steps S13 to S15 shown in FIG. 4).

In a case in which correction amount CA1 calculated by correction amount calculation section 42 is used when component mounting machine WM3 mounts component 91 in accordance with pad 90a, mounting position MP1 of component 91 is inappropriate. Accordingly, correction amount calculation device 40 of the present embodiment includes permission section 43. As a result, correction amount calculation device 40 can allow or restrict the use of correction amount CA1 calculated by correction amount calculation section 42 in accordance with the mounting method of component 91. The above description can be similarly applied to a case in which permission section 43 is provided in component mounting machine WM3.

Permission section 43 determines whether the mounting process is performed in accordance with solder 92, for example, based on a production plan of board product 900 (step S13). In a case in which the mounting process is performed in accordance with solder 92 (Yes in step S13), permission section 43 allows the use of correction amount CA1 calculated by correction amount calculation section 42 (step S14). In this case, permission section 43 transmits correction amount CA1 calculated by correction amount calculation section 42 to component mounting machine WM3.

In a case in which the mounting process is performed in accordance with pad 90a (No in step S13), permission section 43 restricts the use of correction amount CA1 calculated by correction amount calculation section 42 (step S15). In this case, permission section 43 does not transmit correction amount CA1 calculated by correction amount calculation section 42 to component mounting machine WM3.

1-3-4. Second Acquisition Section 44

Figure 5:
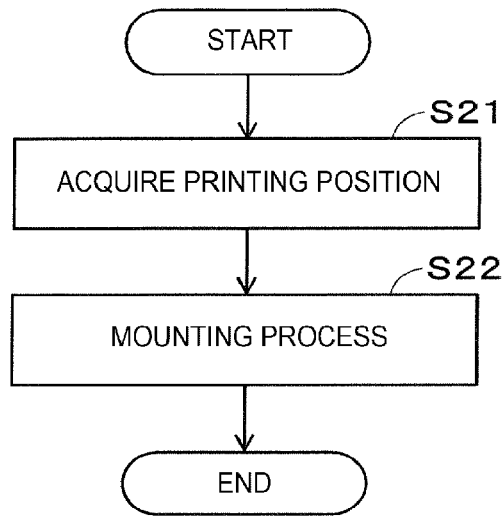
FIG. 5 is a flowchart showing an example of a control procedure by component mounting machine WM3.

Second acquisition section 44 acquires printing position PP1 of solder 92 printed by printing machine WM1 (step S21 shown in FIG. 5). Second acquisition section 44 is provided in control device 16 of component mounting machine WM3 shown in FIG. 2.

Component mounting machine WM3 can perform the mounting process for mounting component 91 based on printing position PP1. Component mounting machine WM3 can perform the mounting process, for example, based on printing position PP1 inspected by printing inspection machine WM2. Further, as in the present embodiment, component mounting machine WM3 can also perform the mounting process based on printing position PP1 acquired by second acquisition section 44 provided in component mounting machine WM3.

Second acquisition section 44 can cause board camera 15 shown in FIG. 2 to image first mark portion FM1 and second mark portion FM2 shown in FIG. 6, perform the image processing on the acquired images, acquire the position and the angle of board 90 to obtain the board coordinate system. In addition, second acquisition section 44 can perform the image processing on the image obtained by capturing solder 92 to acquire the coordinate values of printing positions PP1 of the predetermined number of solders 92.

Printing machine WM1 can print solder 92 on board 90 by using, for example, a mask plate and a squeegee. In this case, printing machine WM1 horizontally moves the squeegee along a surface of the mask plate to which solder 92 is supplied in a state in which board 90 is in contact with a lower surface of the mask plate. As a result, solder 92 is printed on an upper surface of board 90 via a pattern hole in the mask plate.

In this case, first positional deviation amount MA1, which is the positional deviation amount of solder 92 with respect to pad position PD1 of printing position PP1, is considered to be the same on one board 90. Accordingly, second acquisition section 44 can estimate the coordinate value of printing position PP1 of another solder 92 based on acquired printing positions PP1 of the predetermined number of solders 92.

In addition, printing machine WM1 can apply solder 92 for each target mounting position RF1 of board 90 by, for example, using a dispense head. In this case, second acquisition section 44 can cause the imaging device having a wider field of view than board camera 15 to image board 90, perform the image processing on the acquired image, and acquire the coordinate value of printing position PP1 of solder 92.

1-3-5. Mounting Process Section 45

Mounting process section 45 performs the mounting process based on printing position PP1 acquired by second acquisition section 44 and correction amount CA1 calculated by correction amount calculation section 42 (step S22 shown in FIG. 5). Mounting process section 45 is provided in control device 16 of component mounting machine WM3 shown in FIG. 2.

Specifically, mounting process section 45 can add correction amount CA1 in X-axis direction BX calculated by correction amount calculation section 42 to the X-coordinate of printing position PP1 acquired by second acquisition section 44 to calculate the X-coordinate of the scheduled mounting position in the mounting process. In addition, mounting process section 45 can add correction amount CA1 in Y-axis direction BY calculated by correction amount calculation section 42 to the Y-coordinate of printing position PP1 acquired by second acquisition section 44 to calculate the Y-coordinate of the scheduled mounting position in the mounting process.

In addition, mounting process section 45 can change the scheduled mounting position in the mounting process each time correction amount CA1 is calculated by correction amount calculation section 42. Mounting process section 45 can improve the mounting accuracy of component 91 by regularly repeating the process. As described above, correction amount CA1 calculated by correction amount calculation section 42 is used in the mounting process of board product 900 to be produced later.

In a case in which correction amount calculation section 42 calculates correction amount CA1 based on one board 90, correction amount CA1 calculated by correction amount calculation section 42 can be applied from board product 900 to be produced immediately after board 90. In addition, as in the present embodiment, in a case in which board work line WML includes multiple component mounting machines WM3, board product 900 is often continuously produced.

In this case, even in a case in which correction amount CA1 is calculated based on one board 90, correction amount CA1 calculated by correction amount calculation section 42 can be applied from board product 900 to be produced after the mounting process of multiple board products 900. In addition, in a case in which correction amount CA1 is calculated based on multiple boards 90, correction amount CA1 calculated by correction amount calculation section 42 can be applied from board product 900 to be produced after the mounting process of multiple board products 900.

2. Correction Amount Calculation Method and Component Mounting Method

The above description of correction amount calculation device 40 can be similarly applied to the correction amount calculation method. Specifically, the correction amount calculation method is a correction amount calculation method applied to board work line WML including printing inspection machine WM2, component mounting machine WM3, and appearance inspection machine WM4, and includes a first acquisition step and a correction amount calculation step. The first acquisition step corresponds to the control performed by first acquisition section 41. The correction amount calculation step corresponds to the control performed by correction amount calculation section 42. Further, it is preferable that the correction amount calculation method further include a permission step. The permission step corresponds to the control performed by permission section 43.

The component mounting method includes a second acquisition step and a mounting process step. The second acquisition step corresponds to the control performed by second acquisition section 44. The mounting process step corresponds to the control performed by mounting process section 45. It should be noted that the permission step can be included in the component mounting method.

3. Example of Effects of Embodiment

With correction amount calculation device 40, first acquisition section 41 and correction amount calculation section 42 are provided. As a result, correction amount calculation device 40 can calculate correction amount CA1 when third positional deviation amount MA3, which is the positional deviation amount of mounting position MP1 with respect to printing position PP1, is corrected by using both first positional deviation amount MA1 and second positional deviation amount MA2. The above description of correction amount calculation device 40 can be similarly applied to the correction amount calculation method.

REFERENCE SIGNS LIST

40: correction amount calculation device, 41: first acquisition section, 42: correction amount calculation section, 43: permission section, 44: second acquisition section, 45: mounting process section, 90: board, 90a: pad, 91: component, 92: solder, 900: board product, PD1: pad position, PP1: printing position, MP1: mounting position, MA1: first positional deviation amount, MA2: second positional deviation amount, MA3: third positional deviation amount, CA1: correction amount, ID1: board identification information, RF1: target mounting position, PT1: component type, WM1: printing machine, WM2: printing inspection machine, WM3: component mounting machine, WM4: appearance inspection machine, WML: board work line

The invention claimed is:

1. A correction amount calculation device comprising:
   in a board work line including a printing inspection machine configured to inspect a printing position of solder printed by a printing machine, a component mounting machine configured to perform a mounting process of mounting a component based on the printing position, and an appearance inspection machine configured to inspect a mounting position of the component mounted by the component mounting machine,
   a first acquisition section configured to acquire a first positional deviation amount, which is a positional deviation amount of the printing position detected by the printing inspection machine with respect to a pad position, and a second positional deviation amount, which is a positional deviation amount of the mounting position detected by the appearance inspection machine with respect to the pad position; and
   a correction amount calculation section configured to, based on the first positional deviation amount and the second positional deviation amount, calculate a correction amount, which is used in the mounting process of a board product to be produced later, regarding a third positional deviation amount, which is a positional deviation amount of the mounting position with respect to the printing position.

2. The correction amount calculation device according to claim 1,
   wherein the correction amount calculation section is configured to store, regarding multiple boards of the same type, board identification information for identifying the board and the third positional deviation amount for each target mounting position of multiple components to be mounted on the board in association with each other, and calculate the correction amount for each target mounting position based on a distribution of a predetermined number of the third positional deviation amounts for each target mounting position.

3. The correction amount calculation device according to claim 1,
   wherein the correction amount calculation section is configured to store, regarding multiple boards of the same type, board identification information for identifying the board and the third positional deviation amount for each component type of multiple components to be mounted on the board in association with each other, and calculate the correction amount for each component type based on a distribution of a predetermined number of the third positional deviation amounts for each component type.

4. The correction amount calculation device according to claim 2,
   wherein the correction amount calculation section is configured to calculate the correction amount when it is determined that the distribution of the third positional deviation amounts is in a management state by using a Shewhart control chart.

5. The correction amount calculation device according to claim 1, further comprising:
   a permission section configured to allow the use of the correction amount calculated by the correction amount calculation section when the component is mounted in accordance with the solder, and restrict the use of the correction amount calculated by the correction amount calculation section when the component is mounted in accordance with a pad.

6. A component mounting machine comprising:
   a second acquisition section configured to acquire a printing position of solder printed by a printing machine; and
   a mounting process section configured to perform the mounting process based on the printing position acquired by the second acquisition section and the correction amount calculated by the correction amount calculation device according to claim 1.

7. The component mounting machine according to claim 6, further comprising:
   a permission section configured to allow the use of the correction amount calculated by the correction amount calculation section when a component is mounted in accordance with the solder, and restrict the use of the correction amount calculated by the correction amount calculation section when the component is mounted in accordance with a pad.

8. A correction amount calculation method which is applied to a board work line including a printing inspection machine configured to inspect a printing position of solder printed by a printing machine, a component mounting machine configured to perform a mounting process of mounting a component based on the printing position, and an appearance inspection machine configured to inspect a mounting position of the component mounted by the component mounting machine, the method comprising:
   a first acquisition step of acquiring a first positional deviation amount, which is a positional deviation amount of the printing position detected by the printing inspection machine with respect to a pad position, and a second positional deviation amount, which is a positional deviation amount of the mounting position detected by the appearance inspection machine with respect to the pad position; and a correction amount calculation step of calculating, based on the first positional deviation amount and the second positional deviation amount, a correction amount, which is used in the mounting process of a board product to be produced later, regarding a third positional deviation amount, which is a positional deviation amount of the mounting position with respect to the printing position.

\* \* \* \* \*